US011476266B2

(12) United States Patent
Luo et al.

(10) Patent No.: US 11,476,266 B2
(45) Date of Patent: Oct. 18, 2022

(54) MICROELECTRONIC DEVICES INCLUDING STAIRCASE STRUCTURES, AND RELATED MEMORY DEVICES, ELECTRONIC SYSTEMS, AND METHODS

(71) Applicant: Micron Technology, Inc., Boise, ID (US)

(72) Inventors: Shuangqiang Luo, Boise, ID (US); Nancy M. Lomeli, Boise, ID (US); Lifang Xu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 228 days.

(21) Appl. No.: 16/799,543

(22) Filed: Feb. 24, 2020

(65) Prior Publication Data
US 2021/0265371 A1  Aug. 26, 2021

(51) Int. Cl.
| H01L 27/11582 | (2017.01) |
| H01L 27/11556 | (2017.01) |
| G11C 5/06 | (2006.01) |
| G11C 5/02 | (2006.01) |

(52) U.S. Cl.
CPC ........ *H01L 27/11556* (2013.01); *G11C 5/025* (2013.01); *G11C 5/06* (2013.01); *H01L 27/11582* (2013.01)

(58) Field of Classification Search
CPC ......... H01L 27/11551; H01L 27/11556; H01L 27/11578; H01L 27/11582
See application file for complete search history.

(56) References Cited

U.S. PATENT DOCUMENTS

| 9,064,576 B2 | 6/2015 | Tanzawa |
| 9,941,209 B2 | 4/2018 | Tessariol et al. |
| 10,141,330 B1 | 11/2018 | Lindsay et al. |
| 10,269,626 B2 | 4/2019 | Ha et al. |

(Continued)

FOREIGN PATENT DOCUMENTS

KR  10-2010-0021981 A   2/2010

OTHER PUBLICATIONS

Luo et al. , Microelectronic Devices Including Staircase Structures, and Related Memory Devices and Electronic Systems, U.S. Appl. No. 16/,542,116, filed Aug. 15, 2019.

(Continued)

*Primary Examiner* — Christopher A Johnson
(74) *Attorney, Agent, or Firm* — TraskBritt

(57) ABSTRACT

A microelectronic device comprises a stack structure comprising vertically alternating conductive structures and insulating structures arranged in tiers, the tiers individually comprising one of the conductive structures and one of the insulating structures, a staircase structure within the stack structure and having steps comprising edges of at least some of the tiers, conductive contact structures on the steps of the staircase structure, support pillar structures laterally offset in at least a first direction from the conductive contact structures and extending through the stack structure, and bridge structures comprising an electrically insulating material extending vertically through at least a portion of the stack structure and between at least some adjacent support pillar structures of the support pillar structures. Related memory devices, electronic systems, and methods are also described.

24 Claims, 8 Drawing Sheets

(56) References Cited

U.S. PATENT DOCUMENTS

| 10,381,080 | B2 | 8/2019 | Pan et al. |
| 2011/0316063 | A1 | 12/2011 | Tang et al. |
| 2016/0293621 | A1 | 10/2016 | Huang et al. |
| 2016/0343727 | A1* | 11/2016 | Kim ................. H01L 27/11575 |
| 2018/0108667 | A1* | 4/2018 | Chang ............... H01L 27/11521 |
| 2018/0294225 | A1 | 10/2018 | Lee et al. |

OTHER PUBLICATIONS

Luo et al., Microelectronic Devices Including Staircase Structures, and Related Memory Devices and Electronic Systems, U.S. Appl. No. 16/667,704, filed Oct. 29, 2019.
International Search Report for Application No. PCT/US2021/015530, dated May 18, 2021, 3 pages.
Written Opinion of the International Searching Authority for Application No. PCT/US2021/015530, dated May 18, 2021, 6 pages.

* cited by examiner

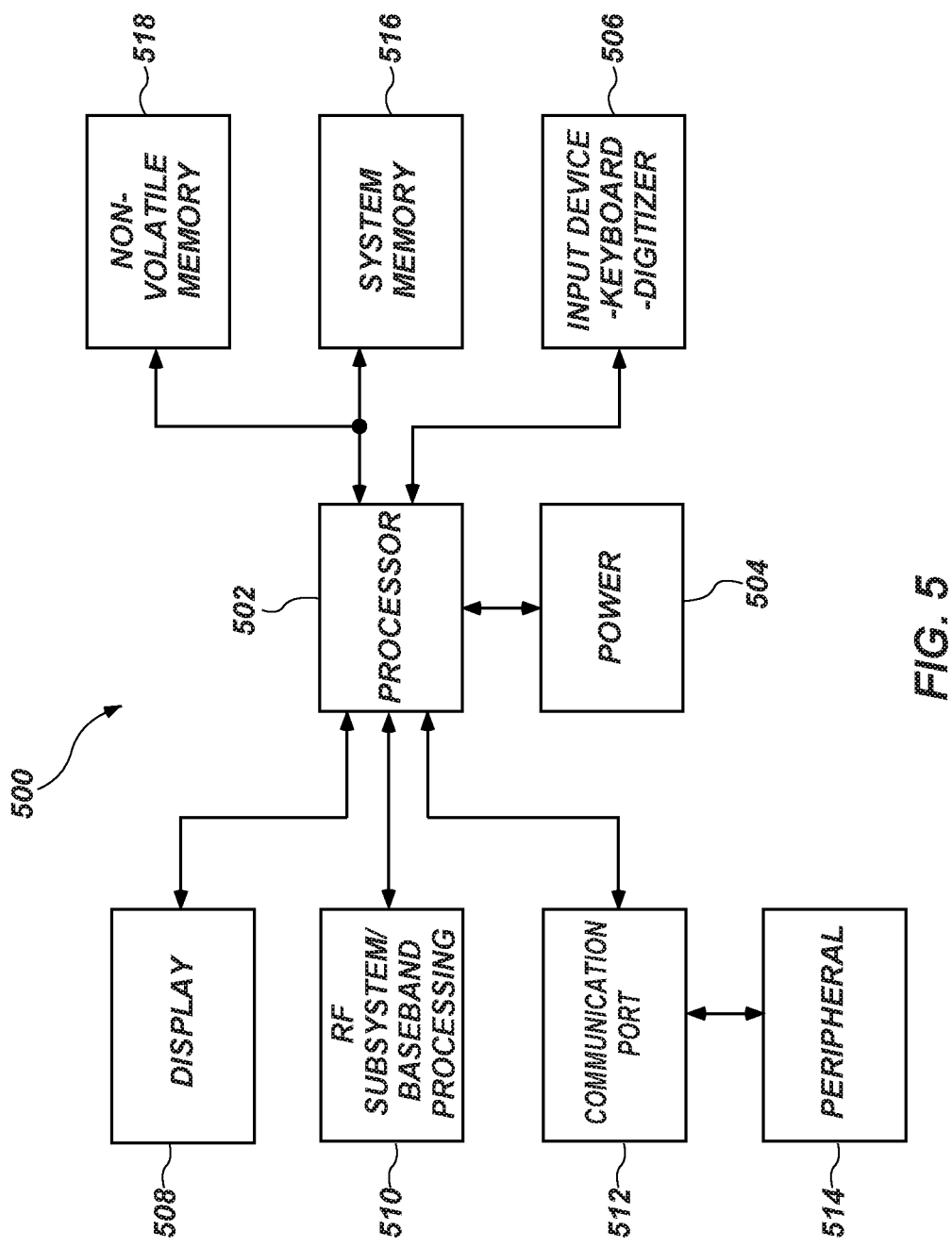

MICROELECTRONIC DEVICES INCLUDING STAIRCASE STRUCTURES, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices including staircase structures, and to related memory devices, electronic systems, and methods.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions of the conductive structures, upon which conductive contact structures can be positioned to provide electrical access to the conductive structures.

After formation of staircase structures, electrically insulating materials are formed over the staircase structures followed by formation of conductive contact structures to the individual steps of the staircase structures. As the memory density has increased (e.g., by providing a greater number of decks and steps within the staircase structure) to provide for additional memory strings in a given area, the aspect ratio and volume of spaces to be filled with the electrically insulating material has increased. However, even with state of the art fill options, such as plasma-enhanced atomic layer deposition, the electrically insulating material may not uniformly or completely fill the volume between the staircase structures. Since the volumes may not be uniformly or completely filled with the electrically insulating material, the conductive contact structures may undesirably electrically short to each other.

BRIEF DESCRIPTION OF THE DRAWINGS

FIG. 5 is a processor-based system, in accordance with embodiments of the disclosure.

DETAILED DESCRIPTION

Figure 1:
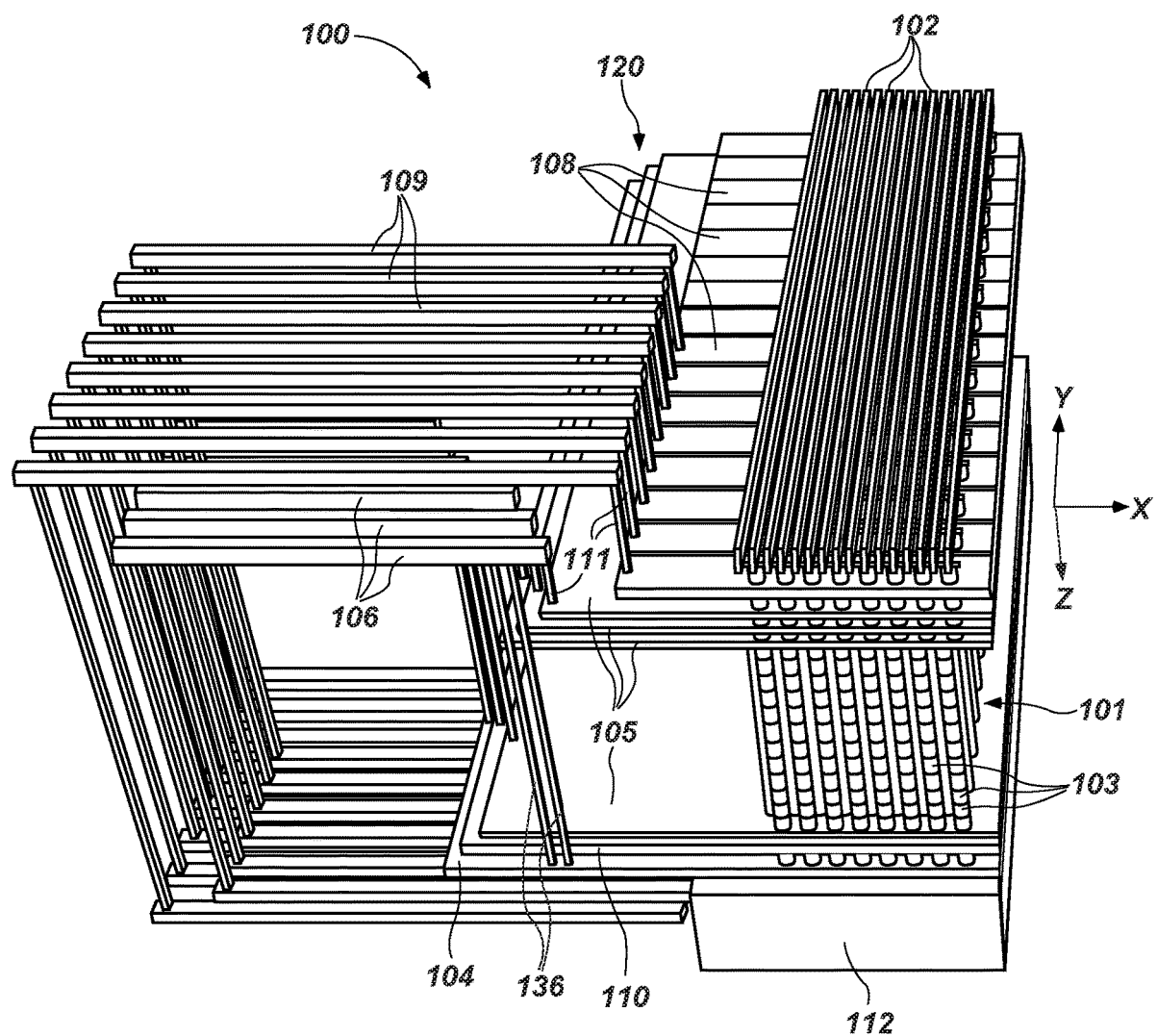
FIG. 1 is a simplified cutaway perspective view of a microelectronic device, according to embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a memory device, such as a 3D NAND Flash memory device) or a complete microelectronic device including bridge structures between conductive contact structures. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "memory device" means and includes microelectronic devices exhibiting memory functionality, but not necessary limited to memory functionality. Stated another way, and by way of example only, the term "memory device" means and includes not only conventional memory in the form of DRAM, NAND, etc., but also an application specific integrated circuit (ASIC) (e.g., a system on a chip (SoC)), and a microelectronic device combining logic and memory, or a graphics processing unit (GPU) incorporating memory.

According to embodiments described herein, a microelectronic device structure includes a stack structure comprising vertically alternating conductive structures and insulating structures arranged in tiers. A staircase structure may be defined within the stack structure and include steps comprising edges of at least some of the tiers. Conductive contact structures may be electrically connected to the steps of the staircase structure. The conductive contacts may be located laterally central between slots defining the staircase structure and may be symmetrically located within the block and between the slots. Support pillar structures may extend through the staircase structure. The support pillar structures may be laterally offset in a first direction and in a second direction perpendicular to the first direction from the conductive contact structures. Bridge structures may be located between at least some of the adjacent support pillar structures and may facilitate electrical isolation of adjacent conductive contact structures. Stated another way, the bridge structures may block an electrical path between adjacent conductive contact structures to prevent shorting of the adjacent conductive contact structures.

The microelectronic device structure may be formed by forming a stack structure comprising tiers of vertically alternating insulating structures and other insulating structures. The staircase structure may be formed within the stack structure and an insulating material may be formed over the staircase structure. In some embodiments, due to the method of formation of the insulating material and the aspect ratio of the insulating material, the insulating material may include seams (gaps, voids) therein. After forming the insulating material, openings may be formed through the stack structure, including the staircase structure and through portions of the seams. The support contact structures may be formed within the openings and within the seams to form bridge structures between at least some of the support pillar structures. After forming the support pillar structures, slots may be formed through the staircase structure and the other insulating structures may be replaced with a conductive material to form conductive structures. Thereafter, conductive contact structures may be formed symmetrically between the slots and electrically coupled to the conductive structures. Formation of the bridge structures may prevent electrical shorting between adjacent conductive contact structures.

FIG. 1 is a simplified cutaway perspective view of a microelectronic device (e.g., a semiconductor device, a memory device (e.g., a vertical memory device), such as a 3D NAND Flash memory device), according to embodiments of the disclosure. The microelectronic device 100 includes a staircase structure 120 defining contact regions for connecting access lines 106 to conductive tiers 105 (e.g., conductive layers, conductive plates, etc.). The microelectronic device 100 may include vertical strings 101 of memory cells 103 that are coupled to each other in series. The vertical strings 101 may extend vertically (e.g., in the Z-direction) and orthogonally to conductive lines and tiers 105, such as data lines 102, a source tier 104, the conductive tiers 105, the access lines 106, first select gates 108 (e.g., upper select gates, drain select gates (SGDs)), select lines 109, and a second select gate 110 (e.g., a lower select gate, a source select gate (SGS)).

Vertical conductive contacts 111 may electrically couple components to each other as shown. For example, the select lines 109 may be electrically coupled to the first select gates 108 and the access lines 106 may be electrically coupled to the conductive tiers 105. The microelectronic device 100 may also include a control unit 112 positioned under the memory array, which may include at least one of string driver circuitry, pass gates, circuitry for selecting gates, circuitry for selecting conductive lines (e.g., the data lines 102, the access lines 106, etc.), circuitry for amplifying signals, and circuitry for sensing signals. The control unit 112 may be electrically coupled to the data lines 102, the source tier 104, the access lines 106, the first select gates 108, and the second select gates 110, for example.

The first select gates 108 may extend horizontally in a first direction (e.g., the X-direction) and may be coupled to respective first groups of vertical strings 101 of memory cells 103 at a first end (e.g., an upper end) of the vertical strings 101. The second select gate 110 may be formed in a substantially planar configuration and may be coupled to the vertical strings 101 at a second, opposite end (e.g., a lower end) of the vertical strings 101 of memory cells 103.

The data lines 102 (e.g., bit lines) may extend horizontally in a second direction (e.g., in the Y-direction) that is at an angle (e.g., perpendicular) to the first direction in which the first select gates 108 extend. The data lines 102 may be coupled to respective second groups of the vertical strings 101 at the first end (e.g., the upper end) of the vertical strings 101. A first group of vertical strings 101 coupled to a respective first select gate 108 may share a particular vertical string 101 with a second group of vertical strings 101 coupled to a respective data line 102. Thus, a particular vertical string 101 may be selected at an intersection of a particular first select gate 108 and a particular data line 102.

The conductive tiers 105 (e.g., word line plates) may extend in respective horizontal planes. The conductive tiers 105 may be stacked vertically, such that each conductive tier 105 is coupled to all of the vertical strings 101 of memory cells 103, and the vertical strings 101 of the memory cells 103 extend vertically through the stack of conductive tiers 105. The conductive tiers 105 may be coupled to or may form control gates of the memory cells 103 to which the conductive tiers 105 are coupled. Each conductive tier 105 may be coupled to one memory cell 103 of a particular vertical string 101 of memory cells 103.

The first select gates 108 and the second select gates 110 may operate to select a particular vertical string 101 of the memory cells 103 between a particular data line 102 and the source tier 104. Thus, a particular memory cell 103 may be selected and electrically coupled to a data line 102 by operation of (e.g., by selecting) the appropriate first select gate 108, second select gate 110, and conductive tier 105 that are coupled to the particular memory cell 103.

The staircase structure 120 may be configured to provide electrical connection between the access lines 106 and the tiers 105 through the vertical conductive contacts 111. In other words, a particular level of the tiers 105 may be selected via an access line 106 in electrical communication with a respective conductive contact 111 in electrical communication with the particular tier 105.

Support pillar structures 136 may vertically extend (e.g., in the Z-direction) through the staircase structure 120 to the source tier 104. As will be described herein, the support pillar structures 136 may serve as support structures for the formation of the conductive tiers 105 of the staircase structure 120 using a so called "replacement gate" or "gate last" processing acts. As will be described herein, at least some of the support pillar structures 136 may include a bridge structure extending horizontally therebetween that may facilitate electrical isolation of the vertical conductive contacts 111 from one another.

Figure 2A:
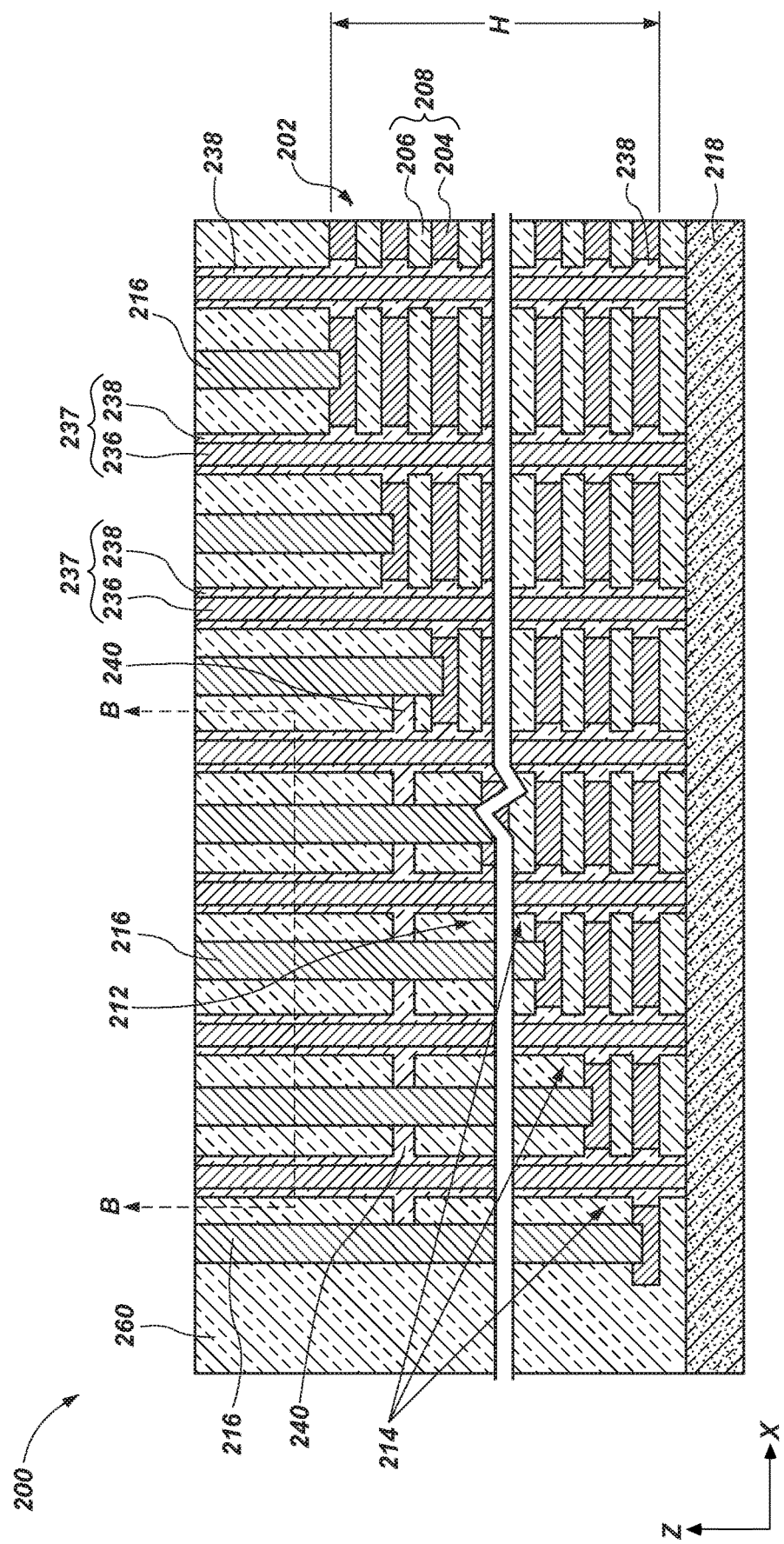
FIG. 2A is a simplified, partial cross-sectional view of a microelectronic device structure, in accordance with embodiments of the disclosure.
Figure 2B:
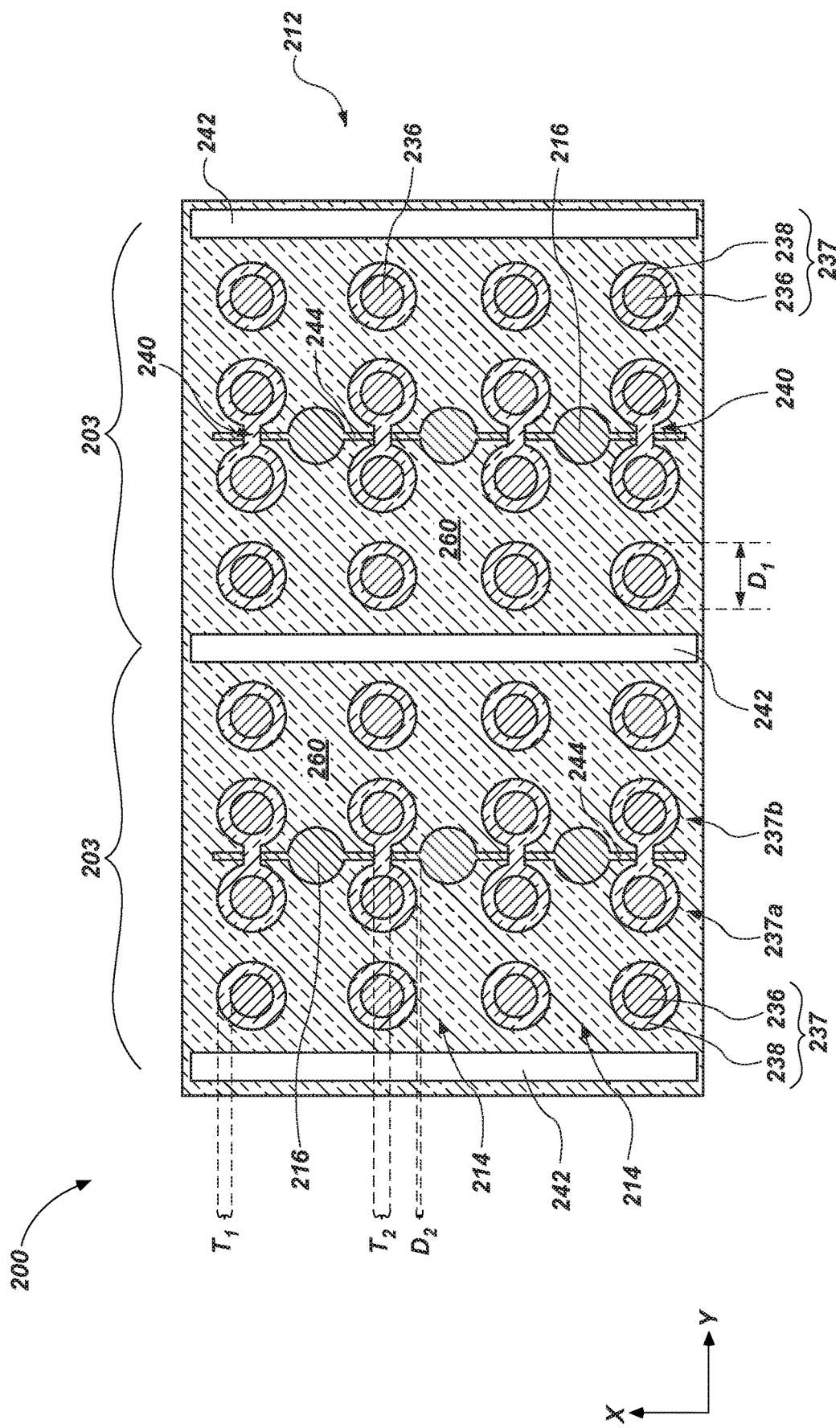
FIG. 2B is a simplified, partial top-down view of the microelectronic device structure taken through section line B-B of FIG. 2A.

FIG. 2A is a simplified, partial cross-sectional view of a microelectronic device structure 200 of a microelectronic device (e.g., the microelectronic device 100 of FIG. 1), in accordance with embodiments of the disclosure. The microelectronic device structure 200 may, for example, comprise a portion of a memory device (e.g., a multi-deck 3D NAND Flash memory device, such as a dual deck 3D NAND Flash memory device). FIG. 2B is a simplified, partial top-down view of the microelectronic device structure 200 taken through section line B-B of FIG. 2A.

With reference to FIG. 2A, the microelectronic device structure 200 includes a stack structure 202 including a vertically alternating (e.g., in the Z-direction) sequence of conductive structures 204 (e.g., access line plates, word line plates) and insulating structures 206 arranged in tiers 208. The conductive structures 204 may correspond to the conductive tiers 105 of FIG. 1. Each of the tiers 208 of the stack structure 202 may include at least one (1) of the conductive structures 204 vertically-neighboring at least one of the insulating structures 206. The stack structure 202 may include a desired quantity of the tiers 208. For example, the stack structure 202 may include greater than or equal to ten (10) of the tiers 208, greater than or equal to twenty-five (25) of the tiers 208, greater than or equal to fifty (50) of the tiers 208, greater than or equal to one hundred (100) of the tiers 208, greater than or equal to one hundred and fifty (150) of the tiers 208, or greater than or equal to two hundred (200) of the tiers 208 of the conductive structures 204 and the insulating structures 206.

The conductive structures 204 of the tiers 208 of the stack structure 202 may be formed of and include at least one conductive material, such as a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. In some embodiments, the conductive structures 204 are formed of and include tungsten.

Each of the conductive structures 204 may individually include a substantially homogeneous distribution of the at least one conductive material, or a substantially heterogeneous distribution of the at least one conductive material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the conductive structures 204 of each of the tiers 208 of the stack structure 202 exhibits a substantially homogeneous distribution of conductive material. In additional embodiments, at least one of the conductive structures 204 of at least one of the tiers 208 of the stack structure 202 exhibits a substantially heterogeneous distribution of at least one conductive material. The conductive structure 204 may, for example, be formed of and include a stack of at least two different conductive materials. The conductive structures 204 of each of the tiers 208 of the stack structure 202 may each be substantially planar, and may each exhibit a desired thickness.

The insulating structures 206 of the tiers 208 of the stack structure 202 may be formed of and include at least one dielectric material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulating structures 206 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the insulating structures 206 are formed of and include $SiO_2$. Each of the insulating structures 206 may individually include a substantially homogeneous distribution of the at least one insulating material, or a substantially heterogeneous distribution of the at least one insulating material. In some embodiments, each of the insulating structures 206 of each of the tiers 208 of the stack structure 202 exhibits a substantially homogeneous distribution of insulating material. In additional embodiments, at least one of the insulating structures 206 of at least one of the tiers 208 of the stack structure 202 exhibits a substantially heterogeneous distribution of at least one insulating material. The insulating structures 206 may, for example, be formed of and include a stack (e.g., laminate) of at least two different insulating materials. The insulating structures 206 of each of the tiers 208 of the stack structure 202 may each be substantially planar, and may each individually exhibit a desired thickness.

At least one lower conductive structure 204 of the stack structure 202 may be employed as at least one lower select gate (e.g., at least one source side select gate (SGS)) of the microelectronic device structure 200. In some embodiments, a single (e.g., only one) conductive structure 204 of a vertically lowermost tier 208 of the stack structure 202 is employed as a lower select gate (e.g., a SGS) of the microelectronic device structure 200. In addition, upper conductive structure(s) 204 of the stack structure 202 may be employed as upper select gate(s) (e.g., drain side select gate(s) (SGDs)) of the microelectronic device structure 200. In some embodiments, horizontally-neighboring conductive structures 204 of a vertically uppermost tier 208 of the stack structure 202 are employed as upper select gates (e.g., SGDs) of the microelectronic device structure 200.

With continued reference to FIG. 2A, the microelectronic device structure 200 may further include at least one staircase structure 212 (corresponding to the staircase structure 120 (FIG. 1)) including steps 214 (e.g., contact regions) defined by edges of the tiers 208. The quantity of steps 214 included in the staircase structure 212 may be substantially the same as (e.g., equal to) or may be different than (e.g., less than, greater than) the quantity of tiers 208 in each the stack structure 202. As shown in FIG. 2A, in some embodiments, the steps 214 of the staircase structure 212 are arranged in order, such that steps 214 directly horizontally adjacent one another in the X-direction correspond to tiers 208 of the stack structure 202 directly vertically adjacent (e.g., in the Z-direction) one another. In additional embodiments, the steps 214 of the staircase structure 212 are arranged out of order, such that at least some steps 214 of the staircase structure 212 directly horizontally adjacent one another in the X-direction correspond to tiers 208 of stack structure 202 not directly vertically adjacent (e.g., in the Z-direction) one another.

A height H of the staircase structure 212 in the Z-direction between, for example, an uppermost step 214 and a lowermost step 214 may be within a range from about 5.0 μm to about 20.0 μm, such as from about 5 microns (μm) to about 10.0 μm, from about 10.0 μm to about 15.0 μm, or from about 15.0 μm to about 20.0 μm. In some embodiments, the height H is about 13.5 μm. However, the disclosure is not so limited and the height H may be different than those described.

An insulating material 260 may overlie the staircase structure 212 and provide electrical insulation between components thereof. The insulating material 260 may be formed of and include one or more of the materials described above with reference to the insulating structures 206. In some embodiments, the insulating material 260 comprises the same material composition as the insulating structures 206. In some embodiments, the insulating material 260 comprises silicon dioxide.

Referring to FIG. 2B, the stack structure 202 (FIG. 2A) may be partitioned in the Y-direction orthogonal to the X-direction by slots 242. The slots 242 may vertically extend (e.g., in the Z-direction shown in FIG. 2A) into the stack structure 202. The slots 242 may, for example, vertically extend completely through the stack structure 202. The slots 242 may divide (e.g., in the Y-direction) the stack structure 202 into multiple blocks 203. The slots 242 may, for example, be employed to form the conductive structures 204 (FIG. 2A) of the stack structure 202 through so-called "replacement gate" or "gate last" processing acts, as described in further detail below. In some embodiments, each of the steps 212 within each block 203 may be contacted by a conductive contact structure 216.

In some embodiments, at least some (e.g., all) of the blocks 203 may be subdivided with second slots located at, for example, end portions (in the Y-direction) of the staircase structure 212 to subdivide (in the Y-direction) the blocks 203 into multiple sub-blocks. The second slots may, for example, be employed to further divide at least the uppermost conductive structures 204 (FIG. 2A) of the stack structure 202 so that the uppermost conductive structures 204 may be employed as upper select gates (e.g., SGDs) of the blocks 203 of the stack structure 202.

With returned reference to FIG. 2A, the microelectronic device structure 200 may further include conductive contact structures 216 contacting (e.g., physically contacting, electrically contacting) the steps 214 of the staircase structure 212 to provide electrical access to the conductive structures 204 of the stack structure 202. The conductive contact structures 216 may correspond to the vertical conductive contacts 111 of FIG. 1. With reference to FIG. 2B, the conductive contact structures 216 may be symmetrically located with the blocks 203 such that they are located between (in the Y-direction) the slots 242. In some such embodiments, the blocks 203 may be symmetrical. In some embodiments, the conductive contact structures 216 are located centrally (in the Y-direction) between adjacent slots 242. Stated another way, the conductive contact structures 216 may be located about equally between the slots 242 defining the particular block 203 within which the conductive contact structures 216 are located.

The conductive contact structures 216 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). Each of the conductive contact structures 216 may have substantially the same material composition, or at least one of the conductive contact structures 216 may have a different material composition than at least one other of the conductive contact structures 216. In some embodiments, the conductive contact structures 216 comprise titanium, titanium nitride, and tungsten. In some embodiments, the conductive contact structures 216 comprise a liner comprising titanium nitride defining external portions thereof and tungsten defining internal portions thereof.

At least some of the tiers 208 of the stack structure 202 may be coupled to at least one of the conductive contact structures 216 at one or more of the steps 214 of the staircase structure 212. Referring to FIG. 2B, in some embodiments, at least some of the conductive contact structures 216 on the steps 214 of the staircase structure 212 are horizontally-aligned with one another. For example, as shown in FIG. 2B, at least some (e.g., all) conductive contact structures 216 horizontally-neighboring one another in the X-direction (and, hence, on steps 214 at different vertical positions than one another) within the same block 203 may be substantially aligned with one another in the Y-direction. As another example, as also shown in FIG. 2B, at least some (e.g., all) conductive contact structures 216 horizontally-neighboring one another in the Y-direction (and, hence, on steps 214 at substantially the same vertical position as one another) may be substantially aligned with one another in the X-direction. In some embodiments, each block 203 may include a single conductive contact structure 216 on each step 214 and an individual block 203 may not include conductive contact structures 216 horizontally aligned with one another in the Y-direction located in the same block 203. In some such embodiments, the conductive contact structures 216 horizontally-neighboring each other in the Y-direction may be located in adjacent blocks 203.

With returned reference to FIG. 2A, the microelectronic device structure 200 further includes a source tier 218 underlying the stack structure 202. The source tier 218 may correspond to the source tier 104 of FIG. 1. The source tier 218 may comprise a source structure, such as a source plate. The source tier 218 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe).

Referring to FIG. 2A and FIG. 2B, the microelectronic device structure 200 may further include support pillar structures 237 comprising a first material 236 vertically extending through the stack structure 202 and to the source tier 218 and a liner material 238 on sidewalls of the first material 236. The support pillar structures 237 may correspond to the support pillar structures 136 of FIG. 1. The liner material 238 may substantially surround (e.g., substantially horizontally and vertically cover) sidewalls of the first material 236.

It will be understood that although FIG. 2A illustrates various components and structures as being located within the same plane for ease of understanding, the disclosure is not so limited. For example, although FIG. 2A illustrates that the support pillars structures 237 are located in the same plane as the conductive contact structures 216, it will be understood that the support pillar structures 237 are laterally offset in the X-direction and the Y-direction from the conductive contact structures 216, as illustrated in FIG. 2B.

The first material 236 may be formed of and include at least one conductive material, such as such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the first material 236 of each of the support pillar structures 237 has substantially the same material composition.

In other embodiments, the first material 236 is formed of and includes an electrically insulating material. In some such embodiments, the first material 236 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first material 236 comprise $SiO_2$. In some embodiments, such as where the first material 236 comprises an electrically insulating material, the microelectronic device structure 200 may not include the liner material 238 on sidewalls of the first material 236 and the support pillar structures 237 may comprise only the first material 236 (e.g., an electrically insulating material).

The support pillar structures 237 may each individually exhibit any desired geometric configuration (e.g., dimensions and shape) and spacing. The geometric configurations and spacing of the support pillar structures 237 may be selected at least partially based on the configurations and positions of other components (e.g., the steps 214 of the staircase structure 212, the conductive contact structures 216, the source tier 218) of the microelectronic device structure 200. For example, the support pillar structures 237 may each individually have a geometric configuration and spacing permitting the support pillar structure 237 to vertically-extend (e.g., in the Z-direction) through the stack structure 202 and physically contact (e.g., land on) a structure of the source tier 218 to facilitate a predetermined function (e.g., an electrical interconnection function, a support function) of the support pillar structure 237. In other embodiments, the support pillar structure 237 does not include an electrical interconnection function and exhibits a support function. Each of the support pillar structures 237 may exhibit substantially the same geometric configuration (e.g., the same dimensions and the same shape) and horizontal spacing (e.g., in the X-direction) as each other of the support pillar structures 237, or at least some of the support pillar structures 237 may exhibit a different geometric configuration (e.g., one or more different dimensions, a different shape) and/or different horizontal spacing than at least some other of the support pillar structures 237. In some embodiments, the support pillar structures 237 are at least partially uniformly spaced in the X-direction. In other embodiments, the support pillar structures 237 are at least partially non-uniformly spaced in the X-direction.

At least some of the support pillar structures 237 are horizontally-aligned with one another. For example, referring to FIG. 2B, at least some (e.g., all) support pillar structures 237 horizontally-neighboring one another in the X-direction may be substantially aligned with one another in the Y-direction. In some embodiments, at least some (e.g., all) of the support pillar structures 237 are horizontally offset from the conductive contact structures 216. For example, the support pillar structures 237 may be horizontally offset in the X-direction and in the Y-direction with the conductive contact structures 216. Stated another way, the support pillar structures 237 may not be aligned with the conductive contact structures 216 in the X-direction or in the Y-direction. In some embodiments, the conductive contact structures 216 are located horizontally between (in the Y-direction) two adjacent ones of the support pillar structures 237 that are horizontally offset (in the X-direction) from the conductive contact structures 216. Adjacent conductive contact structures 216 may be located between (in the Y-direction) adjacent ones of the support pillar structures 237. As only one example, and with reference to FIG. 2B, a first support pillar structure 237a and a second support pillar structure 237b adjacent to the first support pillar structure 237a may be horizontally aligned in the Y-direction with each other. A conductive contact structure 216 directly adjacent the first support pillar structure 237a and the second support pillar structure 237b in the X-direction (and offset from the first support pillar structure 237a and the second support pillar structures 237b in the X-direction) may be located between the first support pillar structure 237a and the second support pillar structure 237b in the Y-direction.

The support pillar structures 237 may serve as support structures during and/or after the formation of one or more components of the microelectronic device structure 200. For example, the support pillar structures 237 may serve as support structures for the formation of the conductive structures 204 of the tiers 208 of the stack structure 202 using so called "replacement gate" or "gate last" processing acts. During replacement gate processing, a preliminary stack structure including a vertically alternating (e.g., in the Z-direction) sequence of the insulating structures 206 and sacrificial structures (e.g., additional insulating structures selectively etchable relative to the insulating structures 206, such as dielectric nitride structures if the insulating structures 206 comprise dielectric oxide structures) may be subjected to a material removal process to selectively remove (e.g., selectively exhume) at least a portion (e.g., all, less than all) of each the sacrificial structures relative to the insulating structures 206. Thereafter, open volumes (e.g., void spaces) formed by the removed portions of the sacrificial structures may be filled with a conductive material to form the conductive structures 204. The support pillar structures 237 may impede (e.g., prevent) tier collapse during the selective removal of the sacrificial structures.

The liner material 238 may be horizontally interposed between each of the first materials 236 of the support pillar structures 237 and the tiers 208 (including the conductive structures 204 and the insulating structures 206 thereof) of the stack structure 202. With reference to FIG. 2A, in some embodiments, the liner material 238 includes a greater dimension in the X-direction and the Y-direction adjacent the conductive structures 204 than along other portions of the support pillar structures 237.

The liner material 238 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner material 238 comprises Sift. In some embodiments, the liner material 238 has a different material composition as the insulating material 260. In other embodiments, the liner material 238 has the same material composition as the insulating material 260. In some embodiments, the liner material 238 comprises a material composition that is not substantially removed responsive to exposure to etch chemistries formulated and configured to remove silicon nitride.

A dimension (e.g., a diameter) $D_1$ of the support pillar structures 237 may be within a range from about 100 nanometers (nm) to about 500 nm, such as from about 100 nm to about 200 nm, from about 200 nm to about 300 nm, from about 300 nm to about 400 nm, or from about 400 nm to about 500 nm. However, the disclosure is not so limited and the dimension $D_1$ may be different than those described.

A thickness $T_1$ of the liner material 238 may be within a range from about 300 Angstroms (Å) to about 800 Å, such as from about 300 Å to about 400 Å, from about 400 Å to about 500 Å, from about 500 Å to about 600 Å, from about 600 Å to about 700 Å, from about 700 Å to about 800 Å, or from about 800 Å to about 900 Å. In some embodiments, the thickness $T_1$ is about 650 Å. However, the disclosure is not so limited and the thickness Ti may be different than those described.

With reference to FIG. 2A and FIG. 2B, bridge structures 240 may extend between and couple horizontally adjacent (e.g., in the Y-direction) support pillar structures 237. Referring to FIG. 2B, the bridge structures 240 may extend between and couple only some of the horizontally adjacent support pillar structures 237. For example, the support pillar structures 237 that are located directly adjacent (in the X-direction and the Y-direction) to one or more conductive pillar structures 216 may include a bridge structure 240 therebetween. As one example, a bridge structure 240 may extend between the first support pillar structure 237a and the second support pillar structure 237b. In some embodiments, the microelectronic device structure 200 may not include bridge structures 240 extending between support pillar structures 237 that do not include a conductive pillar structure 216 located horizontally adjacent to and between the support pillar structures 237. As one example, support pillar structures 237 that are located closer to the slots 242 than the other support pillar structure 237 may not be in communication with a bridge structure 240. Accordingly, some of the support pillar structures 237 may be in communication with a bridge structure 240 and others of the support pillar structures 237 may not be in communication with a bridge structure 240.

The bridge structures 240 may each have a thickness $T_2$ in the X-direction from about 600 Å to about 1,800 Å, such as from about 600 Å to about 900 Å, from about 900 Å to about 1,200 Å, from about 1,200 Å to about 1,500 Å, or from about 1,500 Å to about 1,800 Å. In some embodiments, the thickness $T_2$ is about 1300 Å. In some embodiments, the thickness $T_2$ is greater than the thickness $T_1$. For example, the thickness $T_2$ may be at least twice the thickness $T_1$. In other embodiments, the thickness $T_2$ is less than twice the thickness $T_1$. In some embodiments, the thickness $T_2$ of the bridge structure 240 may be less than the dimension $D_1$ of the support pillar structure 237.

In some embodiments, the microelectronic device structure 200 includes about one bridge structure 240 for every about one conductive pillar structure 216 within the staircase structures 212. In other embodiments, the microelectronic device structure 200 may include about one more bridge structure 240 than a number of the conductive pillar structures 216 within the staircase structure 212. In some embodiments, the microelectronic device structure 200 includes about one bridge structure 240 for every about four support pillar structures 237 within the staircase structure 212.

In some embodiments, the bridge structure 240 has the same material composition as the liner material 238. In some such embodiments, the bridge structure 240 may include at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the bridge structure 240 comprises $SiO_2$. In some embodiments, the bridge structure 240 comprises a material composition that is not substantially removed responsive to exposure to etch chemistries formulated and configured to remove silicon nitride. In some embodiments, the bridge structure 240 comprises a different material composition than the insulating material 260.

With reference to FIG. 2B, in some embodiments, spaces between horizontally adjacent (in the X-direction) conductive pillar structures 216 may include a conductive material 244. The conductive material 244 may have the same material composition as the composition of the conductive pillar structures 216. As will be described herein, the bridge structures 240 may facilitate electrical isolation between the adjacent conductive pillar structures 216 that would otherwise short to each other by means of the conductive material 244.

In some embodiments, a margin $D_2$ between edges of the conductive pillar structures 216 and the adjacent support pillar structures 237 in the X-direction may be from about 500 Å to about 1,500 Å, such as from about 500 Å to about 750 Å, from about 750 Å to about 1,000 Å, from about 1,000 Å to about 1,250 Å, or from about 1,250 Å to about 1,500 Å.

In some embodiments, due to the processing acts by which the conductive pillar structures 216 are formed, the conductive pillar structures 216 having a greater vertical dimension in the Z-direction may exhibit a greater dimension (e.g., diameter) $D_1$ than other conductive pillar structures 216 having a lesser dimension in the Z-direction. In other words, the conductive pillar structures 216 that are in electrical communication with the conductive structures 204 located closer to the source tier 218 may have a larger dimension $D^1$ than conductive pillar structures 216 in electrical communication with conductive structures 204 located farther from the source tier 218. Accordingly, in some embodiments, the thickness $T_2$ of the bridge structures 240 may vary with a location of the bridge structure 240 to maintain a substantially uniform margin $D_2$. In some such embodiments, the thickness $T_2$ of the bridge structures 240 may decrease with an increasing depth of the adjacent electrically conductive pillar structures 216. Stated another way, the thickness $T_2$ of the bridge structures 240 may increase as a height of the steps 214 adjacent to the bridge structure 240 increases.

Figure 2C:
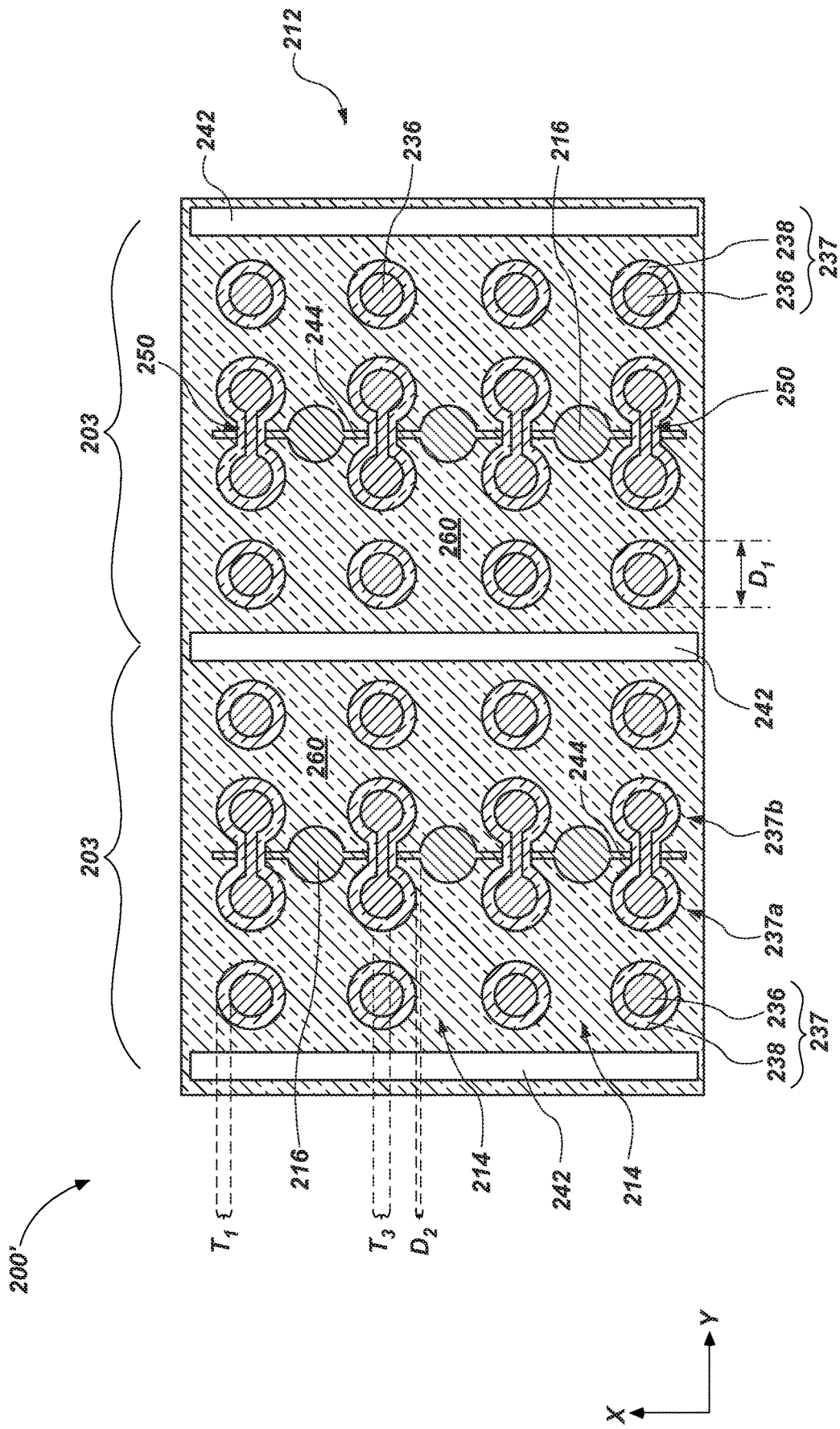
FIG. 2C is a simplified, partial cross-sectional view of a microelectronic device structure, in accordance with embodiments of the disclosure.

Although FIG. 2A and FIG. 2B have been described and illustrated as including bridge structures 240 having a particular shape and configuration, the disclosure is not so limited. FIG. 2C is a simplified partial cross-sectional view of a microelectronic device structure 200', in accordance with embodiments of the disclosure.

The microelectronic device structure 200' is substantially the same as the microelectronic device structure 200 of FIG. 2A and FIG. 2B, except that the microelectronic device structure 200' includes a bridge structure 250 different from the bridge structure 240 of FIG. 2A and FIG. 2B. The bridge structure 250 may comprise the liner material 238 and may further comprise the same material composition as the first material 236 of the support pillar structures 237. Accordingly, the bridge structures 250 may comprise the same material composition as the support pillar structures 237. In some embodiments, the bridge structure 250 includes the first material 236 the support pillar structure pillars 237 extending continuously between adjacent support pillar structures 237. The liner material 238 may extend substantially continuously around the first material 236 and may define a perimeter of the bridge structure 250. In some embodiments, a thickness $T_3$ of the bridge structure 250 may be greater than about 1,300 Å, such as greater than about 1,500 Å. In some embodiments, the thickness $T_3$ is greater than twice the thickness $T_1$ of the liner material 238.

Although FIG. 2A through FIG. 2C have been described and illustrated as comprising the bridge structures 240, 250 having a smaller thickness $T_2$, $T_3$ than the dimension $D^1$ of the support pillar structures 237, the disclosure is not so limited. In other embodiments, the bridge structures 240, 250 may not exhibit a dimension less than the dimension $D^1$. In other words, in some such embodiments, the bridge structure 240, 250 may not exhibit a narrower region proximate the conductive contact structures 216.

Accordingly, in some embodiments, a microelectronic device comprises a stack structure comprising vertically alternating conductive structures and insulating structures arranged in tiers, the tiers individually comprising one of the conductive structures and one of the insulating structures, a staircase structure within the stack structure and having steps comprising edges of at least some of the tiers, conductive contact structures on the steps of the staircase structure, support pillar structures laterally offset in at least a first direction from the conductive contact structures and extending through the stack structure, and bridge structures comprising an electrically insulating material extending vertically through at least a portion of the stack structure and between at least some adjacent support pillar structures of the support pillar structures.

Accordingly, in some embodiments, a memory device comprises a stack structure comprising tiers comprising alternating conductive structures and insulating structures over a source tier, a staircase structure having steps comprising horizontal ends of at least some of the tiers, conductive contact structures in electrical communication with the steps of the staircase structure, support pillar structures extending through the stack structure and horizontally offset from the conductive contact structures, data lines over the stack structure, strings of memory cells extending through the stack structure and in electrical communication with the source tier and the data lines, and a bridge structure between a first support pillar structure and a second support pillar structure adjacent the first support pillar structure, the bridge structure comprising an electrically insulating material electrically isolating conductive contact structures adjacent the first support pillar structure and the second support pillar structure from each other.

Figure 3A:
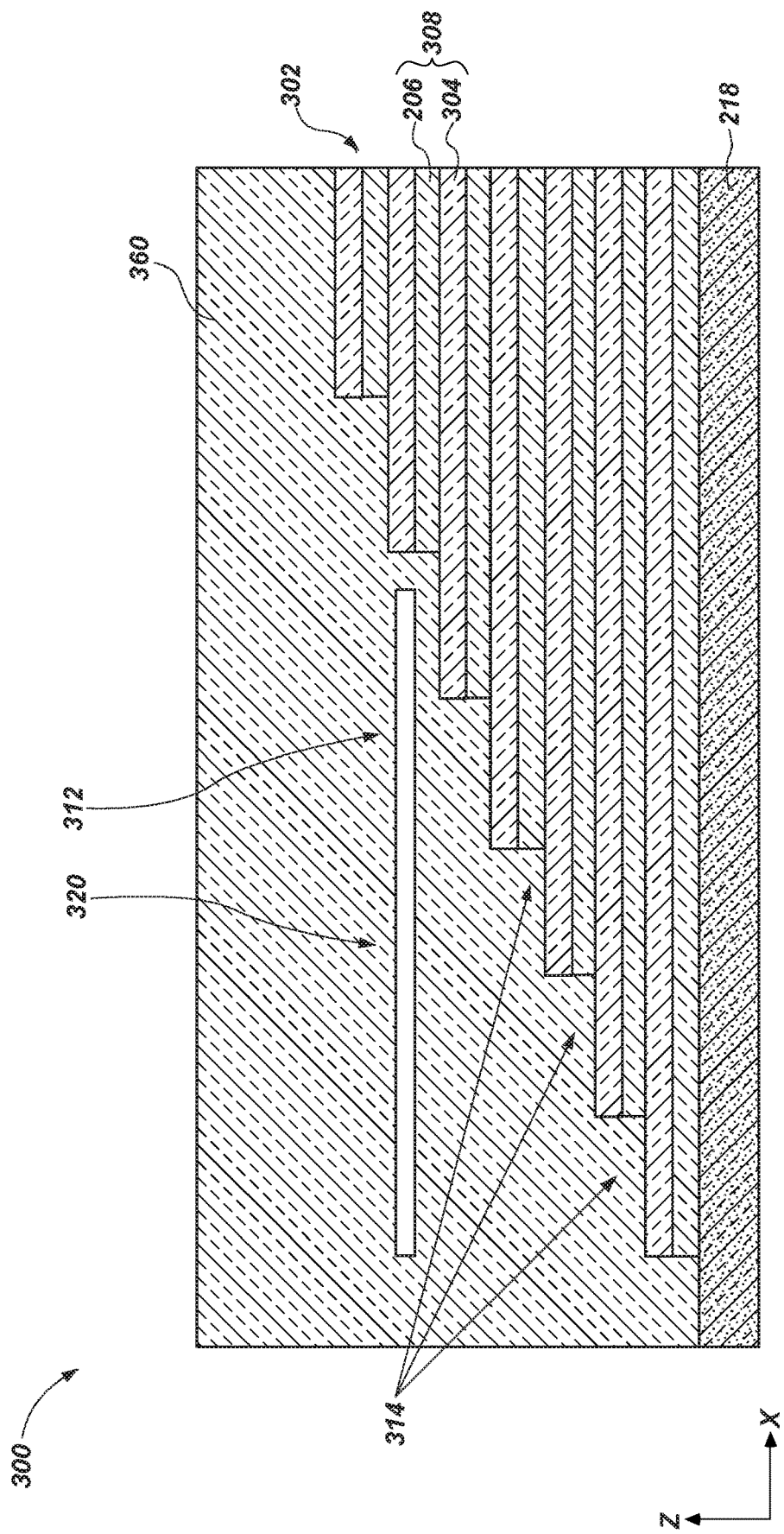
FIG. 3A and FIG. 3B are simplified, partial cross-sectional views illustrating a method of forming a microelectronic device structure, in accordance with embodiments of the disclosure.
Figure 3B:
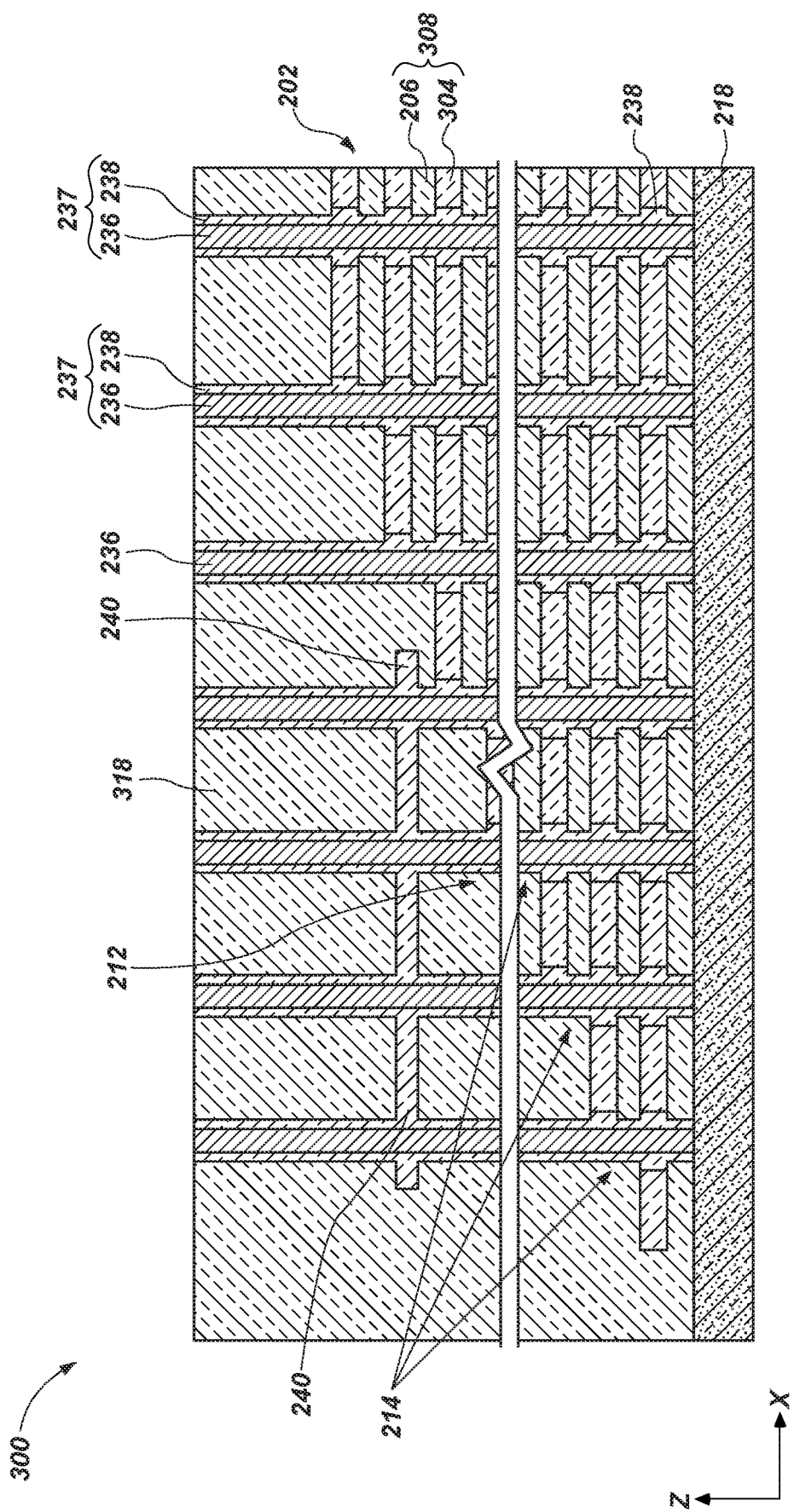

FIG. 3A through FIG. 3B are simplified, partial cross-sectional views illustrating a method of forming a microelectronic device structure, in accordance with embodiments of the disclosure. Referring to FIG. 3A, a microelectronic device structure 300 includes a stack structure 302 including a vertically alternating (e.g., in the Z-direction) sequence of insulating structures 206 and other insulating structures 304 arranged in tiers 308. The stack structure 302 may include a same number of tiers 308 as described above with reference to FIG. 2A.

The insulating structures 206 may be substantially the same as the insulating structures 206 described above with reference to FIG. 2A. The other insulating structures 304 may be formed of and include at least one material (e.g., at least one dielectric material) exhibiting an etch selectivity with respect to the insulating structures 206. For example, the other insulating structures 304 may be formed of and include a nitride material (e.g., silicon nitride ($Si_3N_4$)), an oxynitride material (e.g., silicon oxynitride), or another material. In some embodiments, the other insulating structures 304 comprise a nitride material, such as silicon nitride.

The microelectronic device structure 300 may further include at least one staircase structure 312 including steps 314 defined by edges of the tiers 308. The quantity of steps 314 included in the staircase structure 312 may be substantially the same as (e.g., equal to) or may be different than (e.g., less than, greater than) the quantity of tiers 308 in each the stack structure 302, as described above with reference to FIG. 2A. As shown in FIG. 3A, in some embodiments, the steps 314 of the staircase structure 312 are arranged in order, such that steps 314 directly horizontally adjacent one another in the X-direction correspond to tiers 308 of the stack structure 302 directly vertically adjacent (e.g., in the Z-direction) one another. In additional embodiments, the steps 314 of the staircase structure 312 are arranged out of order, such that at least some steps 314 of the staircase structure 312 directly horizontally adjacent one another in the X-direction correspond to tiers 308 of stack structure 302 not directly vertically adjacent (e.g., in the Z-direction) one another.

In some embodiments, the staircase structure 312 may be formed by forming the stack structure 302 comprising the alternating levels of the insulating structures 206 and the other insulating structures 304. A mask material (e.g., a photoresist material) may be formed over the uppermost tier 308 of the insulating structures 206 and the other insulating structures 304 and an opening may be formed through the mask material to expose the uppermost tier 308. The uppermost tier 308 may be exposed to etch chemistries through the opening to remove the exposed portions of the uppermost tier 308. After removing the exposed portions of the uppermost tier 308 through the opening in the mask material, the mask material may be exposed to a trim chemistry to remove portions of the mask material and expose portions of the uppermost tier 308 corresponding to a width (in the X-direction) of a step 314. After exposing a new portion of the uppermost tier 308, the stack structure 302 is exposed to etch chemistries to remove another tier 308 through the mask material and form another step 314 in the stack structures 302. The process of trimming the photoresist and etching the tiers 308 may be repeated a desired number of times. In some embodiments, a so-called "chop mask" may be formed over some of the stack structure 302 and/or portions of the stack structure 302 and the exposed tiers 308 may be exposed to etch chemistries to etch through some of the exposed tiers 308 to form the staircase structure 312.

After forming the staircase structure 312, an insulating material 360 may be formed adjacent (e.g., over) the steps 314 of the staircase structure 312. The insulating material 360 may include one or more of the materials described above with reference to the insulating material 260. By way of non-limiting example, the insulating material 318 may include silicon dioxide.

In some embodiments, due to the aspect ratio of the insulating material 360 (the vertical height in the Z-direction to the width in one or both of the X-direction and the Y-direction), the insulating material 318 may include one or more so-called seams 320, which may also be referred to as gaps or voids. In some embodiments, the seams 320 may be the result of insufficient gap filling properties of the deposition method of the insulating material 360. The seams 320 may extend in the horizontal direction (e.g., the X-direction). In some embodiments, the seams 320 may also extend in the vertical direction (Z-direction).

Although FIG. 3A illustrates the seam 320 as having a relatively narrow height in the Z-direction, the disclosure is not so limited. In some embodiments, the seam 320 may have a height in the Z-direction up to about 5 μm, for example, and may span several steps 314.

Referring to FIG. 3B, after formation of the microelectronic device structure 300 of FIG. 3A, openings may be formed through the staircase structure 312 at locations corresponding to the support pillar structures 237 (FIG. 2A, FIG. 2B, FIG. 2C). The openings may extend through the seams 320 (FIG. 3A) and be in communication with the seams 320. After forming the openings, the liner material 238 may be formed within the openings. In some embodiments, the liner material 238 substantially fills the seams 320 (FIG. 3A) to from the bridge structure 240. In other embodiments, the liner material 238 lines sidewalls of the seams 320 but does not completely fill the seams 320.

After forming the liner material 238 in the openings, the first material 236 is formed in remaining portions of the openings adjacent to the liner material 238 to form the support pillar structures 237. In some embodiments, such as where the liner material 238 does not completely fill the seams 320, the first material 236 may be located within the bridge structure (e.g., to form the bridge structure 250 of FIG. 2C).

After forming the liner material 238, the support pillar structures 237, and the bridge structure 240, slots (e.g., slots 242 (FIG. 2B)) may be formed through the staircase structure 312. The slots may, for example, vertically extend completely through the stack structure 302 and may divide (e.g., in the Y-direction) the stack structure 202 into multiple blocks, as described above with reference to FIG. 2B.

After forming the slots, the slots may be employed to form the conductive structures 204 (FIG. 2A, FIG. 2C) through so-called "replace gate" or "gate last" processing acts. For example, after forming the slots, the other insulating structures 304 may be removed by exposure to a wet etchant formulated and configured to selectively remove the other insulating structures 304 without substantially removing the insulating structures 206. The wet etchant may comprise, for example, phosphoric acid, sulfuric acid, ammonium fluoride, or ammonium bifluoride. In some embodiments, the wet etchant comprises phosphoric acid.

After removing the other insulating structures 304, conductive structures (e.g., conductive structures 204 (FIG. 2A, FIG. 2C)) may be formed at locations left by the removal of the other insulating structures 304.

After formation of the conductive structures, openings may be formed through the insulating material 318 at locations corresponding to the conductive contact structures 216 (FIG. 2A, FIG. 2B, FIG. 2C) to form conductive contacts (e.g., the conductive contact structures 216) to the conductive structures to form the microelectronic device structure of FIG. 2A.

In some embodiments, formation of the bridge structures 240, 250 (FIG. 2A, FIG. 2B, FIG. 2C) facilitates formation of the conductive contact structures 216 (FIG. 2A, FIG. 2B, FIG. 2C) without shorting to each other, even though the insulating material 260, 360 may include the seams 320 (FIG. 3A). By way of comparison, conventional microelectronic device structures may include conductive contact structures that electrically short to each other through seams that are filled with the electrically conductive material of one or both of support pillar structures or conductive contact structures. For example, tungsten may exhibit improved gap filling properties relative to the materials of the insulating materials 260 and may be more prone to filling the seams compared to the materials of the insulating materials 260. Filling the seams with a conductive material may cause electrical shorting between one or more of the conductive contact structures. By way of comparison, formation of the bridge structures 240, 250 facilitates formation of the conductive contact structures 216 while preventing electrical shorting between one or more of the conductive contact structures 216. In some instances, microelectronic devices having one or more conductive contact structures that are shorted to each other may pass inspection, but may fail in use and operation. Accordingly, the bridge structures 240, 250 facilitate improved reliability of the microelectronic device structures 200, 200'. The bridge structures 240, 250 may be formed without substantially increasing processing acts for the formation of the microelectronic device structures 200, 200'. For example, the bridge structures 240, 250 may be formed by changing a reticle used to pattern the support pillar structures 237 and by performing optical proximity correction (OPC). In addition, since the conductive contact structures 216 are located centrally within the blocks 203, the blocks 203 may not exhibit a stress imbalance, as many conventional microelectronic devices in which the conductive contact structures are not located centrally between slots. For example, many conventional microelectronic devices may include blocks exhibiting asymmetric stresses, leading to block bending and device failure (e.g., such as by improper placement of the conductive contact structures due to the block bending).

Accordingly, in some embodiments, a method of forming a microelectronic device comprises forming openings through a stack structure comprising vertically alternating insulating structures and other insulating structures arranged in tiers and defining a staircase structure having steps comprising edges of at least some of the tiers, the openings extending through at least one seam within an insulating material over the staircase structure, forming an insulating liner material within the openings and within the at least one seam to form support pillar structures, at least some of the support pillar structures adjacent on another coupled together by a bridge structure comprising the insulating liner material, replacing the other insulating structures with a conductive material to form conductive structures, and forming conductive contact structures electrically coupled to the conductive structures of the staircase structure to be laterally offset from the support pillar structures.

Figure 4:
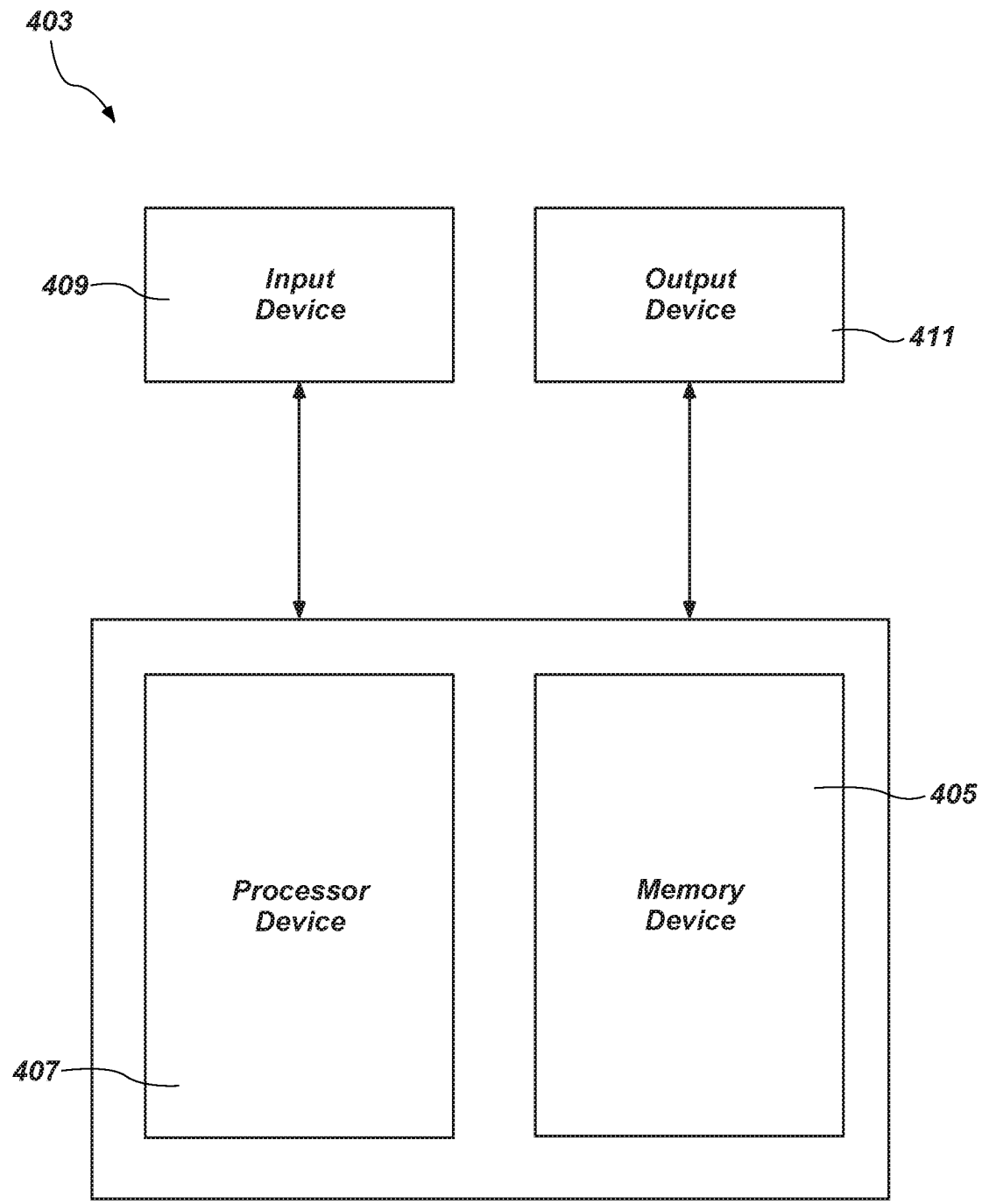
FIG. 4 is a block diagram of an electronic system, in accordance with embodiments of the disclosure.

Microelectronic devices including microelectronic devices (e.g., the microelectronic device 100) and microelectronic device structures (e.g., the microelectronic device structures 200, 200') including the staircase structures (e.g., the staircase structures 120, 212) in accordance with embodiments of the disclosure may be used in embodiments of electronic systems of the disclosure. For example, FIG. 4 is a block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device structure previously described herein (e.g., one of the microelectronic device 100 or the microelectronic device structures 200, 200' previously described with reference to FIG. 1, FIG. 2A, FIG. 2B, and FIG. 2C) including the staircase structures (e.g., the staircase structures 120, 212), the staircase structures including bridge structures (e.g., the bridge structures 240, 250).

The electronic system 403 may further include at least one electronic signal processor device 407 (often referred to as a "microprocessor"). The electronic signal processor device 407 may, optionally, include an embodiment of a microelectronic device or a microelectronic device structure previously described herein (e.g., one or more of the microelectronic device 100 or the microelectronic device structures 200, 200' previously described with reference to FIG. 1, FIG. 2A, FIG. 2B, and FIG. 2C). The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

With reference to FIG. 5, depicted is a processor-based system 500. The processor-based system 500 may include various microelectronic devices and microelectronic device structures (e.g., microelectronic devices and microelectronic device structures including one or more of the microelectronic device 100 or the microelectronic device structures 200, 200') manufactured in accordance with embodiments of the present disclosure. The processor-based system 500 may be any of a variety of types such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and other subcomponents of the processor-based system 500 may include microelectronic devices and microelectronic device structures (e.g., microelectronic devices and microelectronic device structures including one or more of the microelectronic device 100 or the microelectronic device structures 200, 200') manufactured in accordance with embodiments of the present disclosure.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include an AC adapter; therefore, the processor-based system 500 may be plugged into a wall outlet, for example. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may be coupled to the processor 502. The user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, an LED display, a three-dimensional projection, an audio display, or a combination thereof. Furthermore, an RF sub-system/baseband processor 510 may also be coupled to the processor 502. The RF sub-system/baseband processor 510 may include an antenna that is coupled to an RF receiver and to an RF transmitter (not shown). A communication port 512, or more than one communication port 512, may also be coupled to the processor 502. The communication port 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory 516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 may include semiconductor devices, such as the microelectronic devices and microelectronic device structures (e.g., the microelectronic device 100 and the microelectronic device structures 200, 200') described above, or a combination thereof.

The processor 502 may also be coupled to non-volatile memory 518, which is not to suggest that system memory 516 is necessarily volatile. The non-volatile memory 518 may include one or more of STT-MRAM, MRAM, read-only memory (ROM) such as an EPROM, resistive read-only memory (RROM), and flash memory to be used in conjunction with the system memory 516. The size of the non-volatile memory 518 is typically selected to be just large enough to store any necessary operating system, application programs, and fixed data. Additionally, the non-volatile memory 518 may include a high-capacity memory such as disk drive memory, such as a hybrid-drive including resistive memory or other types of non-volatile solid-state memory, for example. The non-volatile memory 518 may include microelectronic devices, such as the microelectronic devices and microelectronic device structures (e.g., the microelectronic device 100 and the microelectronic device structures 200, 200') described above, or a combination thereof.

Accordingly, in some embodiments an electronic system comprises an input device, an output device, a processor device operably coupled to the input device and the output device, and a memory device operably coupled to the processor device and comprising at least one microelectronic device structure. The at least one microelectronic device structure comprises a stack structure comprising tiers of alternating conductive structures and insulating structures, a staircase structure within the stack structures and comprising steps comprising edges of the conductive structures of the alternating conductive structures and insulating structures, conductive contact structures electrically coupled to the conductive structures of the staircase structure, support pillar structures horizontally offset from the conductive contact structures and comprising an electrically insulating material extending through the stack structure, and bridge structures extending between at least some of the support pillar structures and electrically isolating the conductive contact structures from each other.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a stack structure comprising vertically alternating conductive structures and insulating structures arranged in tiers, the tiers individually comprising one of the conductive structures and one of the insulating structures;
a staircase structure within the stack structure and having steps comprising edges of at least some of the tiers;
conductive contact structures on the steps of the staircase structure;
support pillar structures laterally offset in at least a first direction from the conductive contact structures and extending through the stack structure; and
bridge structures comprising an electrically insulating material horizontally extending between at least some adjacent support pillar structures of the support pillar structures, the bridge structures having a vertical height less than a vertical height of the conductive contact structures and electrically isolating conductive contact structures adjacent the support pillar structures.

2. The microelectronic device of claim 1, further comprising an electrically conductive material extending between adjacent conductive contact structures laterally adjacent each other in a second direction, the adjacent conductive contact structures electrically isolated from each other by the bridge structure.

3. The microelectronic device of claim 1, wherein the support pillar structures comprise a conductive material.

4. The microelectronic device of claim 3, wherein the electrically insulating material is in communication with a liner material extending vertically along sidewalls of the at least some adjacent support pillar structures.

5. The microelectronic device of claim 3, wherein the bridge structure further comprises a conductive material electrically connecting the at least some adjacent support pillar structures, the electrically insulating material along sidewalls of the conductive material.

6. The microelectronic device of claim 1, further comprising a liner material around the support pillar structures.

7. The microelectronic device of claim 1, wherein the support pillar structures are laterally offset from the conductive contact structures in a second direction.

8. The microelectronic device of claim 1, wherein the bridge structures have a dimension less than about 130 nm in a second direction.

9. The microelectronic device of claim 1, wherein the electrically insulating material comprises silicon dioxide.

10. The microelectronic device of claim 1, wherein the bridge structure is located vertically below an uppermost tier of the stack structure.

11. A memory device, comprising:
a stack structure comprising tiers comprising alternating conductive structures and insulating structures over a source tier;
a staircase structure having steps comprising horizontal ends of at least some of the tiers;
conductive contact structures in electrical communication with the steps of the staircase structure;
support pillar structures extending through the stack structure and horizontally offset from the conductive contact structures;
data lines over the stack structure;
strings of memory cells extending through the stack structure and in electrical communication with the source tier and the data lines;
a bridge structure between a first support pillar structure and a second support pillar structure adjacent the first support pillar structure, the bridge structure comprising an electrically insulating material electrically isolating conductive contact structures adjacent the first support pillar structure and the second support pillar structure from each other; and
a conductive material extending between horizontally adjacent conductive contact structures, the bridge structure intervening between portions of the conductive material.

12. The memory device of claim 11, wherein the support pillar structures comprise an additional material, the additional conductive material of the first support pillar structure and the additional conductive material of the second support pillar structure in electrical communication with each other.

13. The memory device of claim 11, wherein the support pillar structures comprise an additional material surrounded by a liner material extending vertically along sidewalls of the support pillar structures.

14. The memory device of claim 13, wherein the electrically insulating material has the same material composition as the insulating structures.

15. The memory device of claim 11, wherein the memory device comprises support pillar structures adjacent each other without an intervening bridge structure.

16. The memory device of claim 11, wherein the memory device comprises about one bridge structure for every about four support pillar structures within the staircase structure.

17. The memory device of claim 11, wherein the electrically insulating material comprises silicon dioxide.

18. The memory device of claim 11, wherein the bridge structure has a vertical height less than a vertical height of conductive contact structures.

19. The memory device of claim 11, further comprising additional bridge structures between adjacent support pillar structures, wherein a height of the additional bridge structures increases as a height of the steps adjacent the additional bridge structures increases.

20. A method of forming a microelectronic device, the method comprising:
forming openings through a stack structure comprising vertically alternating insulating structures and other insulating structures arranged in tiers and defining a staircase structure having steps comprising edges of at least some of the tiers, the openings extending through at least one seam within an insulating material over the staircase structure;
forming an insulating liner material within the openings and within the at least one seam to form support pillar structures extending through the stack structure, at least some of the support pillar structures adjacent one another coupled together by a bridge structure comprising the insulating liner material horizontally extending between the at least some of the support pillar structures adjacent one another;
replacing the other insulating structures with a conductive material to form conductive structures to form an additional stack structure comprising vertically alternating conductive structures and the insulating structures arranged in tiers, the tiers individually comprising one of the conductive structures and one of the insulating structures; and forming conductive contact structures on the steps of the staircase structure and electrically coupled to the conductive structures of the staircase structure to be laterally offset from the support pillar structures in at least a first direction, the bridge structures having a vertical height less than a vertical height of the conductive contact structures and electrically isolating conductive contact structures adjacent the support pillar structures.

21. The method of claim 20, further comprising forming an electrically conductive material adjacent to the insulating liner material to form the support pillar structures.

22. The method of claim 20, further comprising forming some other of the support pillar structures to be distal from the bridge structure.

23. The method of claim 22, further comprising forming the at least some of the support pillar structures to be located at a laterally central portion of a block of the staircase structure, the block defined by slots extending through the staircase structure.

24. An electronic system, comprising:
　an input device;
　an output device;
　a processor device operably coupled to the input device and the output device; and
　a memory device operably coupled to the processor device and comprising at least one microelectronic device structure comprising:
　　a stack structure comprising tiers of alternating conductive structures and insulating structures;
　　a staircase structure within the stack structures and comprising steps comprising edges of the conductive structures of the alternating conductive structures and insulating structures;
　　conductive contact structures electrically coupled to the conductive structures of the staircase structure;
　　a first support pillar structure and a second support pillar structure horizontally offset from the conductive contact structures and each comprising an electrically insulating material extending through the stack structure;
　　bridge structures extending between at least some of the support pillar structures and electrically isolating the conductive contact structures from each other; and
　　additional support pillar structures adjacent one another without an intervening bridge structure.

* * * * *

UNITED STATES PATENT AND TRADEMARK OFFICE
CERTIFICATE OF CORRECTION

| | | |
|---|---|---|
| PATENT NO. | : 11,476,266 B2 | |
| APPLICATION NO. | : 16/799543 | |
| DATED | : October 18, 2022 | |
| INVENTOR(S) | : Shuangqiang Luo, Nancy M. Lomeli and Lifang Xu | |

Page 1 of 1

It is certified that error appears in the above-identified patent and that said Letters Patent is hereby corrected as shown below:

In the Specification

| | | |
|---|---|---|
| Column 12, | Line 39, | change "Sift" to --$SiO_2$-- |
| Column 12, | Line 62, | change "thickness Ti" to --thickness $T_1$-- |

Signed and Sealed this
Thirty-first Day of January, 2023

*Katherine Kelly Vidal*

Katherine Kelly Vidal
*Director of the United States Patent and Trademark Office*